US008753972B2

(12) United States Patent
Hébert et al.

(10) Patent No.: US 8,753,972 B2
(45) Date of Patent: Jun. 17, 2014

(54) COPPER BONDING COMPATIBLE BOND PAD STRUCTURE AND METHOD

(75) Inventors: François Hébert, San Mateo, CA (US); Anup Bhalia, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 182 days.

(21) Appl. No.: 13/298,455

(22) Filed: Nov. 17, 2011

(65) Prior Publication Data
US 2012/0064711 A1 Mar. 15, 2012

Related U.S. Application Data

(60) Continuation of application No. 12/541,881, filed on Aug. 14, 2009, now Pat. No. 8,148,256, which is a division of application No. 11/444,977, filed on May 31, 2006, now Pat. No. 7,598,620.

(51) Int. Cl.
*H01L 21/44* (2006.01)
(52) U.S. Cl.
USPC .................. 438/617; 257/E23.015; 257/780; 257/781; 438/614
(58) Field of Classification Search
CPC ............................................. H01L 2924/01079
USPC ............. 257/E23.037, E23.015, E23.02, 778, 257/780–782, 784, 786; 438/108, 617, 666, 438/612, 614, 624; 29/879
See application file for complete search history.

(56) References Cited

U.S. PATENT DOCUMENTS

| | | | | |
|---|---|---|---|---|
| 6,191,023 B1 * | 2/2001 | Chen | .............................. | 438/612 |
| 6,287,950 B1 * | 9/2001 | Wu et al. | ....................... | 438/612 |
| 6,417,087 B1 * | 7/2002 | Chittipeddi et al. | .......... | 438/612 |
| 6,465,337 B1 * | 10/2002 | Lee et al. | ....................... | 438/612 |
| 6,531,384 B1 * | 3/2003 | Kobayashi et al. | ............ | 438/612 |
| 7,196,000 B2 * | 3/2007 | Lee et al. | ....................... | 438/612 |
| 7,420,283 B2 * | 9/2008 | Ito | ................................. | 257/779 |
| 7,429,795 B2 * | 9/2008 | Su et al. | ........................ | 257/734 |
| 7,663,201 B2 * | 2/2010 | Yamada | ........................ | 257/459 |
| 7,701,069 B2 * | 4/2010 | Leong et al. | .................... | 257/779 |
| 2004/0070079 A1 * | 4/2004 | Huang et al. | ................... | 257/778 |
| 2005/0014356 A1 * | 1/2005 | Pozder et al. | ................. | 438/614 |
| 2005/0140027 A1 * | 6/2005 | Fan | ................................ | 257/779 |
| 2005/0208751 A1 * | 9/2005 | Oh et al. | ....................... | 438/614 |

* cited by examiner

*Primary Examiner* — Chris Chu
(74) *Attorney, Agent, or Firm* — James Cai; Schein & Cai LLP

(57) ABSTRACT

A copper bonding compatible bond pad structure and associated method is disclosed. The device bond pad structure includes a buffering structure formed of regions of interconnect metal and regions of non-conductive passivation material, the buffering structure providing buffering of underlying layers and structures of the device.

1 Claim, 4 Drawing Sheets

COPPER BONDING COMPATIBLE BOND PAD STRUCTURE AND METHOD

The present application claims priority to, and is continuation of U.S. patent application Ser. No. 12/541,881 filed on Aug. 13, 2009 now U.S. Pat. No. 8,148,256, which is a divisional patent application of, U.S. patent application Ser. No. 11/444,977 filed on 31 May 2006 now U.S. Pat. No. 7,598,620 and having Franois Hebert and Anup Bhalla listed as inventors. The aforementioned patent applications are incorporated by reference herein.

BACKGROUND OF THE INVENTION

The present invention generally relates to bond pad structures and methods of bonding semiconductor devices to substrates and more particularly to a copper bonding compatible bond pad structure and a method of bonding copper bonding wires to a semiconductor device without damaging device package layers and underlying device structures.

Conventional bonding methods utilize either Al or Au bonding wires to connect the semiconductor device to a substrate such as a leadframe. Al suffers the disadvantage of having high resistance while Au is increasingly expensive.

Cu bonding wires have been considered an inexpensive alternative to Al and Au bonding wires. Cu is inexpensive, readily available, and has low resistance. As such, fewer Cu bonding wires are generally required. However, Cu bonding wires are harder than either Al or Au bonding wires and their use presents challenges not satisfactorily overcome by the prior art.

As Cu and Cu alloys are harder than conventional bonding wires, bonding using Cu and Cu alloy bonding wires may result in damage to the semiconductor device or to package layers forming a device bond pad. With reference to FIG. 1, an exemplary prior art semiconductor device 100 includes a substrate 110 having a semiconductor device (not shown) formed therein. Substrate 110 may be formed of Si and the semiconductor device may include a power MOSFET. A TiNi barrier metal layer 120 is disposed under an Al, AlCu or AlSiCu electrode metal layer 130. A bond pad 140 may be formed by patterning a passivation layer 150 formed of oxynitride or silicon rich oxynitride. Bond pad 140 may include a MOSFET source bond pad.

A Cu bond wire 200 is shown in FIG. 2 and FIG. 3 bonded to the bond pad 140. As shown in FIG. 3, the Cu bond wire 200 has penetrated the electrode metal layer 130 and partially penetrated the barrier metal layer 120. Damage to the barrier metal layer 120 can result in junction leakage and/or device failure over time. In an extreme case (not shown), the Cu bond wire 200 may completely penetrate the barrier metal layer 120 and damage the semiconductor device.

To address this problem, prior art techniques use a very thick electrode metal layer 130. Typical thicknesses are much greater than 3 micron and typically 6 microns. This technique disadvantageously increases material and manufacturing costs making the patterning of fine lines in the device interconnects very difficult.

There is therefore a need in the art for a copper bonding compatible bond pad structure and associated method that does not damage the barrier metal layer or underlying device structures. There is a further need in the art for a bond pad structure and associated method that achieves low contact resistance. There is also a need in the art for a bond pad structure and associated method that can be achieved at no additional processing cost.

SUMMARY OF THE INVENTION

The present invention overcomes the limitations of the prior art by providing a copper bonding compatible bond pad structure and associated method wherein the Cu bonding wire is buffered from the barrier metal layer. This buffering is accomplished by a buffering structure formed in the bond pad. The buffering structure includes regions of electrode metal and regions of dielectric passivation material which serve to buffer the Cu bonding wire and protect the barrier metal layer. The buffering structure is formed by patterning and etching the dielectric passivation layer when forming the bond pad.

In accordance with one aspect of the invention, a device bond pad includes a buffering structure formed of regions of interconnect metal and regions of non-conductive passivation material, the buffering structure providing buffering of underlying layers and structures of the device.

In accordance with yet another aspect of the invention, a method of forming a Cu bonding compatible bond pad structure includes the steps of (a) determining a buffering structure pattern, (b) patterning the buffering structure pattern on a dielectric passivation layer, and (c) processing the buffering structure pattern to create a buffering structure in the bond pad. Cu bonding compatible bond pad structure comprising:

In accordance with still another aspect of the invention, a Cu bonding compatible bond pad structure includes a buffering structure formed of regions of interconnect metal and regions of non-conductive passivation material, wherein the regions of non-conductive passivation material are formed from a dielectric passivation layer and the regions of interconnect metal are formed on an electrode interconnect metal layer underlying the dielectric passivation layer There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of design and to the arrangement of components or process steps set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent methods and systems insofar as they do not depart from the spirit and scope of the present invention.

DETAILED DESCRIPTION OF THE INVENTION

The following detailed description is of the best modes of carrying out the invention. The description is not to be taken in a limiting sense, but is made merely for the purpose of illustrating the general principles of the invention, since the scope of the invention is best defined by the appended claims.

The present invention generally provides a Cu bonding compatible bond pad structure that buffers bonding damage. A buffering structure is formed in the bond pad when the bond pad is patterned on the dielectric passivation layer deposited and formed on a semiconductor device surface. The buffering structure may include regions of electrode interconnect metal and regions of non-conductive passivation material, the passivation material being patterned in the shape of dots, squares, rectangles, stripes, grid structures, zigzags, chevrons, waves or any other shape or configuration.

Figure 1:
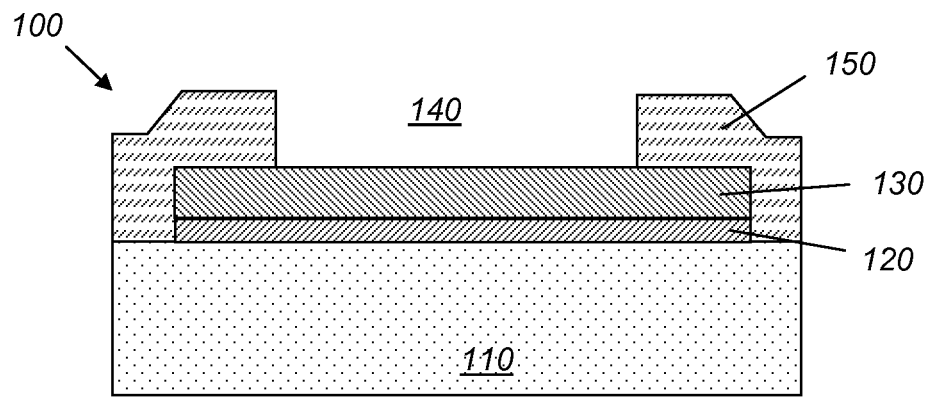
FIG. 1 is a cross sectional view of a prior art bond pad.
Figure 2:
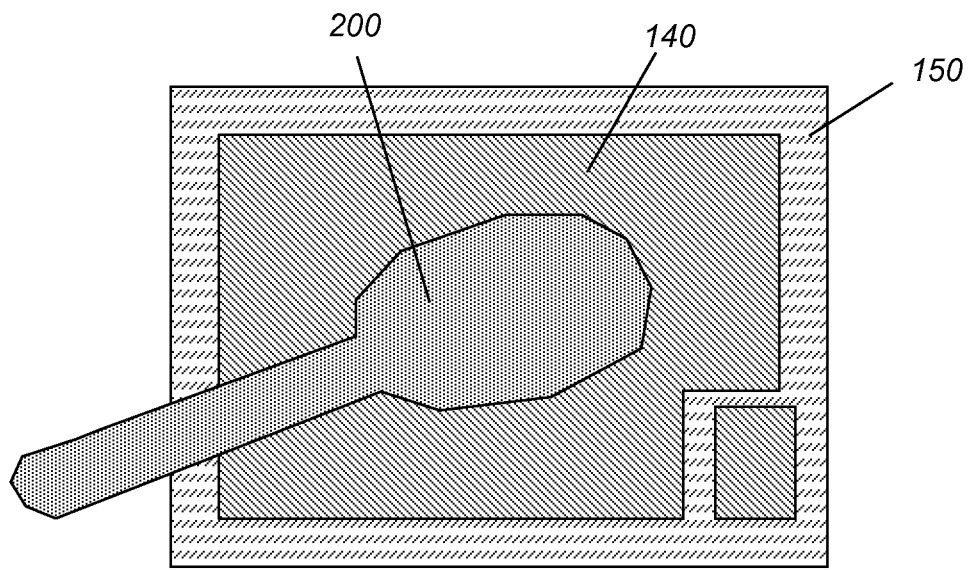
FIG. 2 is a top view of a Cu bonding wire attached to the bond pad of FIG. 1.
Figure 3:
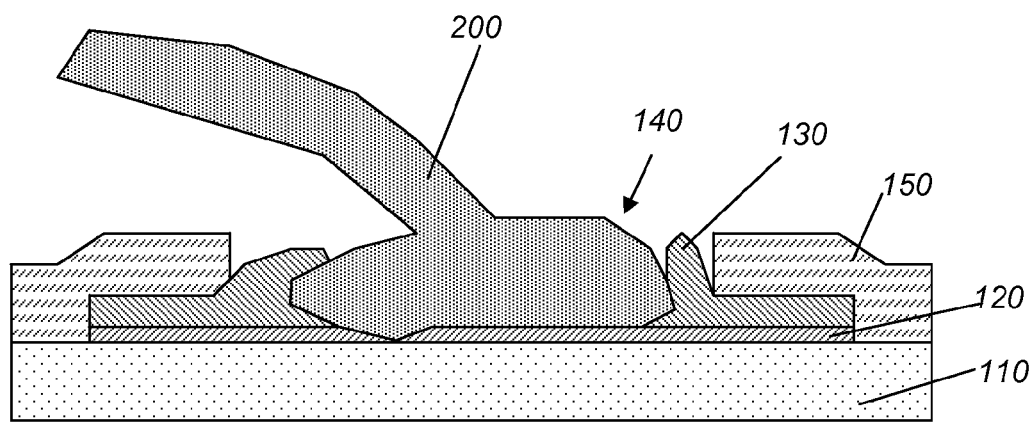
FIG. 3 is a cross sectional view of the Cu bonding wire shown in FIG. 2.
Figure 4:
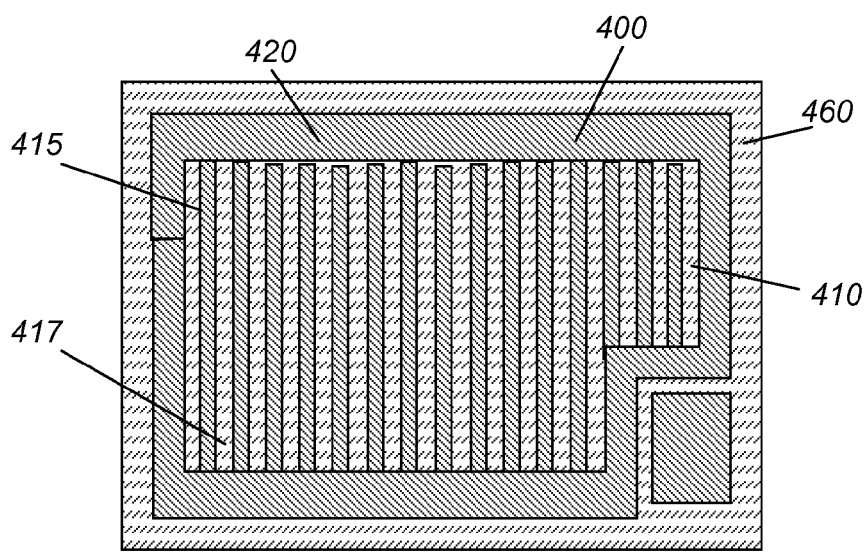
FIG. 4 is a top view of a buffering structure in accordance with the invention.
Figure 5:
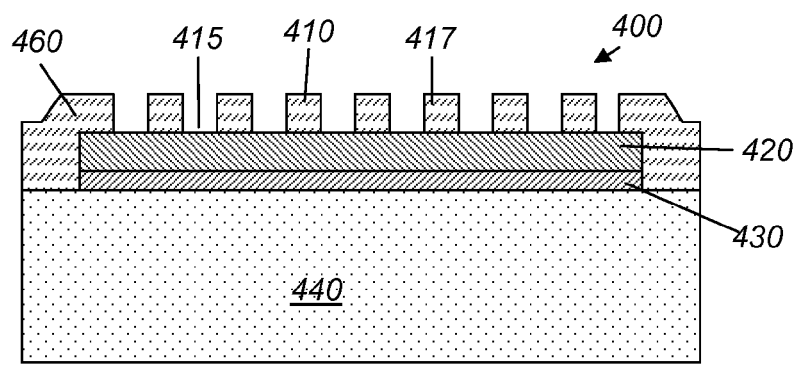
FIG. 5 is a cross sectional view of the buffering structure of FIG. 4 in accordance with the invention.
Figure 6:
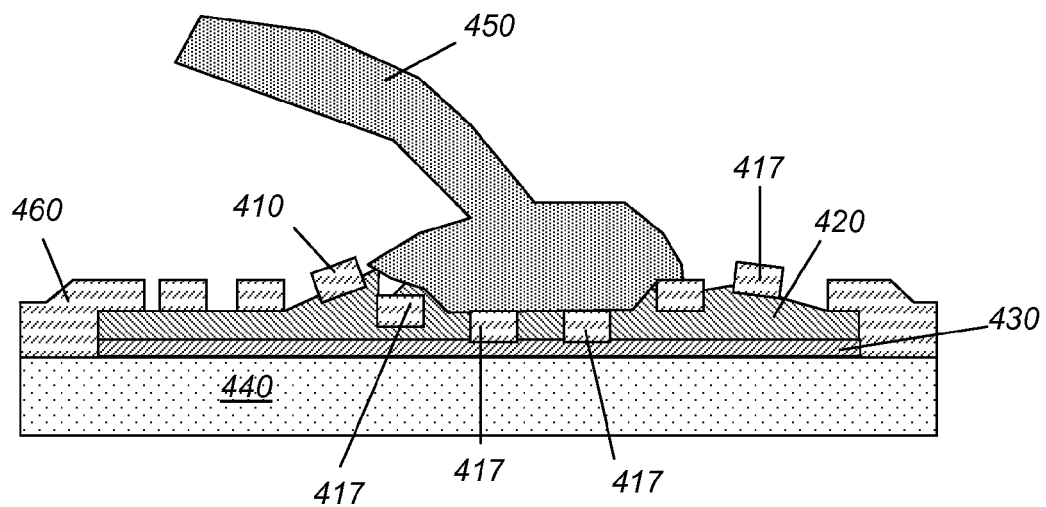
FIG. 6 is a cross sectional view of a Cu bonding wire attached to the buffering structure of FIG. 4 in accordance with the invention.

With reference to FIG. 4, FIG. 5, and FIG. 6, a Cu bonding compatible bond pad structure 400 includes a buffering structure 410 formed in the bond pad structure 400. The buffering structure 410 includes regions 415 of exposed electrode metal of an electrode metal layer 420 and regions 417 of non-conductive passivation material of a passivation layer 460. Regions 417 may include dots, squares, rectangles, stripes, grid structures, zigzags, chevrons, waves or any other shape or configuration. The electrode metal layer 420 may comprise a layer of AlCu or AlSiCu. The electrode metal layer 420 is formed over a TiNi barrier metal layer 430.

Upon bonding of a Cu bonding wire 450 to the bond pad structure 400, the AlCu or AlSiCu of the electrode metal layer 420 will be squeezed by the pressure of the Cu bonding wire 450 and flow in a plurality of directions within the buffering structure 410 around, under and over the regions 417 of the patterned passivation material, depending upon the configuration of the regions 415 and 417. Some of the regions 417 may be pushed into the AlCu or AlSiCu of the electrode metal layer 420 to provide a buffer or cushion to the Cu bonding wire 450 and keep the Cu bonding wire 450 away from the barrier metal layer 430 and a semiconductor device 440.

The pattern and width and spacing of the regions 417 of the patterned passivation material and of the regions 415 of exposed electrode metal can be optimized depending upon the metal of the bonding wire and the bonding conditions. Furthermore, an aspect ratio or pattern density and related dimensions and shapes of the regions 415 and 417 can be optimized to minimize the impact on the contact resistance of the bond. More regions 417 of the patterned passivation material relative to the regions 415 of exposed electrode metal (a higher aspect ratio) may provide for greater barrier layer and underlying device structure protection. Less regions 417 relative to the regions 415 (a lower aspect ratio) may provide for lower contact resistance. Additionally, groupings of regions 415 and 417 can also be utilized in order to limit any stress and movement on the passivation layer 460.

Figure 7:
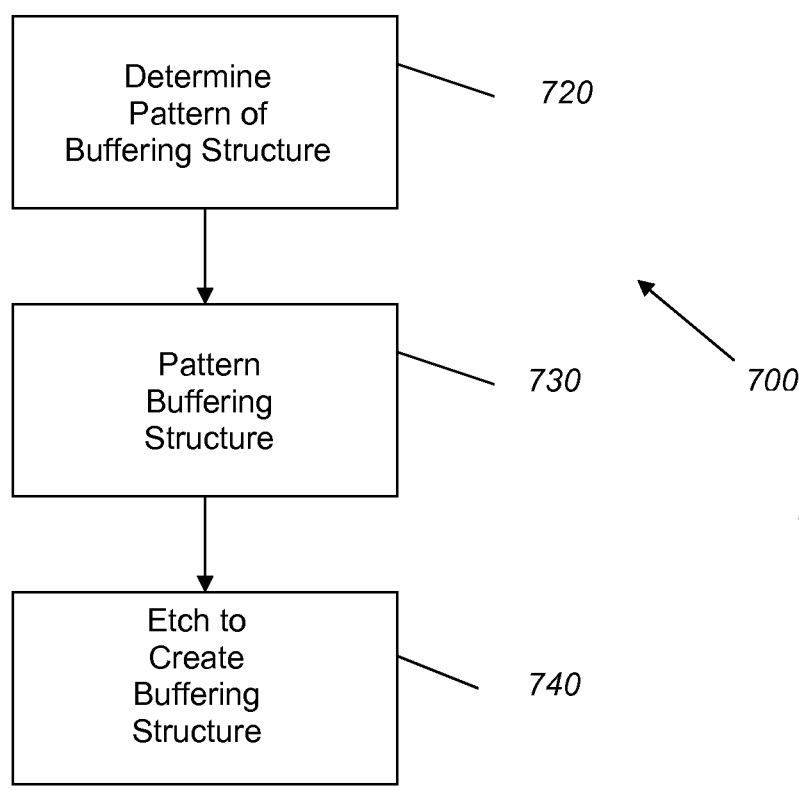
FIG. 7 is a flow chart of a method of forming a buffering structure in accordance with the invention.

A method of forming a Cu bonding compatible bond pad structure in accordance with the invention may include patterning the buffering structure 410 in the bond pad 400. With reference to FIG. 7, a method generally designated 700 includes a step 720 in which the pattern of a buffering structure is determined. The buffering structure pattern may provide for an optimized aspect ratio. The buffering structure pattern is then patterned onto a dielectric passivation layer in a step 730. Finally, the pattern is etched in a step 740 to create the buffering structure. The buffering structure includes regions of exposed electrode metal of an electrode metal layer and regions of non-conductive passivation material.

The present invention advantageously provides for a Cu bonding compatible bond pad structure that buffers Cu bonding damage to the barrier metal layer and the semiconductor device. The bond pad structure can be obtained at no additional processing cost by patterning the passivation layer to create the buffering structure. The buffering structure provides for low contact resistance.

It should be understood, of course, that the foregoing relates to preferred embodiments of the invention and that modifications may be made without departing from the spirit and scope of the invention as set forth in the following claims.

We claim:

1. A method of forming a Cu bonding compatible bond pad structure comprising the steps of:

depositing passivation material upon said bond pad structure;

patterning a buffering structure pattern on said passivation material to provide a plurality of spaced-apart regions of said passivation material spaced-apart along a first direction, defining a plurality of hiatuses, portions of said bond pad structure in superimposition with said hiatuses being exposed and spaced-apart from a crown surface of said regions along a second direction, extending transversely to said first direction;

etching said buffering structure pattern to create said Cu bonding compatible bond pad structure; and attaching a bond wire to a top of said buffer structure pattern pushing a portion of the buffer structure pattern downward for the bond wire connecting to a metal layer underneath the buffer structure pattern.

* * * * *